US011502612B2

(12) United States Patent
Brown et al.

(10) Patent No.: US 11,502,612 B2
(45) Date of Patent: Nov. 15, 2022

(54) PERFORMANCE ENHANCEMENT OF SILICON-BASED DEVICE

(71) Applicant: HELLA GmbH & Co. KGaA, Lippstadt (DE)

(72) Inventors: Alan Wayne Brown, Canton, MI (US); Philip Michael Johnson, Brighton, MI (US)

(73) Assignee: HELLA GmbH & Co. KGaA, Lippstadt (DE)

( * ) Notice: Subject to any disclaimer, the term of this patent is extended or adjusted under 35 U.S.C. 154(b) by 50 days.

(21) Appl. No.: 17/266,252

(22) PCT Filed: Aug. 7, 2019

(86) PCT No.: PCT/IB2019/056726
§ 371 (c)(1),
(2) Date: Feb. 5, 2021

(87) PCT Pub. No.: WO2020/031111
PCT Pub. Date: Feb. 13, 2020

(65) Prior Publication Data
US 2021/0313872 A1 Oct. 7, 2021

Related U.S. Application Data

(60) Provisional application No. 62/716,011, filed on Aug. 8, 2018.

(51) Int. Cl.
*H03K 17/567* (2006.01)
*H02M 3/335* (2006.01)
(Continued)

(52) U.S. Cl.
CPC ..... *H02M 3/33576* (2013.01); *H02M 1/0058* (2021.05); *H03K 17/567* (2013.01); *H02M 1/083* (2013.01)

(58) Field of Classification Search
CPC ............... H02M 1/0058; H02M 3/335; H02M 3/33569; H02M 3/33576; H03K 17/567
See application file for complete search history.

(56) References Cited

U.S. PATENT DOCUMENTS 9,225,196 B2* 12/2015 Huang .................... H02J 50/80
9,735,771 B1* 8/2017 Lu ........................... H01L 29/16
(Continued)

OTHER PUBLICATIONS

International Search Report and Written opinion of PCT/IB2019/056726 dated Nov. 29, 2019, total of 11 pages.

*Primary Examiner* — Gary L Laxton
(74) *Attorney, Agent, or Firm* — Warner Norcross + Judd LLP

(57) ABSTRACT

A power converter is provided. The power converter includes two or more hybrid switching circuits electrically connected to a source or storage element. Each switching circuit includes a wide bandgap device that is parallel-connected to a silicon-based device. The converter further includes a controller that is operatively coupled to each device of the first and second switching circuits. The controller is configured to operate each hybrid switching circuit by (i) activating the silicon-based device for an activation period, (ii) activating the wide bandgap device for a predetermined duty cycle less than the activation period, (iii) deactivating the silicon-based device while the wide bandgap device is activated, and (iv) deactivating the wide bandgap device. The hybrid switching circuits are sequentially operated to convert an alternating current of a power supply into a link voltage for a power converter, for example.

15 Claims, 4 Drawing Sheets

(51) Int. Cl.
*H02M 1/00* (2006.01)
*H02M 1/08* (2006.01)

(56) References Cited

U.S. PATENT DOCUMENTS

| | | |
|---|---|---|
| 2003/0038615 A1 | 2/2003 | Elbanhawy |
| 2013/0342262 A1 | 12/2013 | Konstantinov |
| 2016/0191021 A1* | 6/2016 | Zhao ................ H03K 17/56 |
| | | 327/109 |

* cited by examiner

PERFORMANCE ENHANCEMENT OF SILICON-BASED DEVICE

CROSS-REFERENCE TO RELATED APPLICATIONS

This application claims the benefit of U.S. Provisional Application 62/716,011, filed Aug. 8, 2018, the disclosure of which is incorporated by reference in its entirety.

FIELD OF THE INVENTION

The present invention relates to switch-mode power converters (SMPCs) including multiple semiconductor switches in a parallel arrangement and, in particular, power converters employing soft-switching techniques to provide zero voltage switching (ZVS) and minimal switching losses.

BACKGROUND OF THE INVENTION

In power electronics, a high-current power capability can be provided by electrically connecting multiple semiconductor switches in parallel to permit the undertaking of a load current together. For example, multiple dissimilar switching devices have been used in parallel arrangements because they provide a hybrid switching circuit having a much lower conduction resistance as compared to a single switch. Further by example, Si MOSFETs and GaN high electron mobility transistor (HEMTs) have been used in parallel arrangements to augment the Si MOSFET switching speed with a faster GaN HEMT switching speed.

For example, in ZVS applications both devices turn on with zero voltage stress and the GaN device carries the turn-off stress, allowing the hybrid switching circuit to benefit from the GaN device's faster fall time and lower $E_{off}$ loss. Also by example, in hard switching applications the GaN device is turned on first and turned off last. This requires more complex control but also allows the combination to benefit from the GaN's faster rise and fall times and lower $E_{on}$ and $E_{off}$ losses. However, during the conduction region of both ZVS and hard switching, the GaN device has to share current with the Si device, which limits the current capabilities of the hybrid switching circuit due to the GaN's poor thermal characteristics, which are in turn due to its small die size combined with the poor thermal conduction of silicon. Accordingly, there remains a continued need for an improved switching circuit, for example a power converter, which optimizes operation of Si devices using GaN devices and/or other wide bandgap (WBG) devices.

FIG. 1 illustrates a prior art SMPC and is included as background for the present invention. FIG. 1 generally shows the role of hybrid switching in an SMPC. The SMPC is generally designated 100 and is modeled by resonant circuit topology 180, controlled current source 140, switches $S_1$ and $S_2$, and arbitrary source or storage element $V_{Dclink}$. The controlled current source 140 represents the behavior of an arbitrary soft-switched topology employing ZVS. $S_1$ is turned on when the voltage across it is 0V which allows the SMPC to reduce losses.

SUMMARY OF THE INVENTION

An SMPC and a related switching sequence are provided. In one embodiment, the SMPC includes a first hybrid switching circuit and a second hybrid switching circuit electrically connected to a power supply at a common node as a half-bridge. Each hybrid switching circuit includes a wide bandgap (WBG) device, for example a GaN HEMT, that is parallel-connected to a silicon-based device, for example a Si MOSFET. The converter further includes a controller that is operatively coupled to each device of the first and second switching circuits. The controller is configured to operate the first hybrid switching circuit and second hybrid switching circuit sequentially and respectively by (i) activating the silicon-based device of one hybrid switching circuit for an activation period, (ii) activating the WBG device of the same hybrid switching circuit for a predetermined duty cycle less than the activation period, (iii) deactivating the silicon-based device while the WBG device is activated, and (iv) deactivating the WBG device.

In one method of operation as a half-bridge within a soft-switching SMPC, the controller activates the first silicon-based device for an activation period, activates the first WBG device for a predetermined duty cycle less than the activation period, and deactivates the first silicon-based device while the first WBG device is activated. After the first WBG is deactivated, the controller then activates the second silicon-based device for the activation period, activates the second WBG device for a predetermined duty cycle less than the activation period, and deactivates the second silicon-based device while the second WBG device is activated.

In another method of operation as a dual-active bridge (DAB) SMPC, eight hybrid switching circuits contain a WBG device and a silicon-based device connected in parallel. Four hybrid switching circuits are connected in a full-bridge topology on both sides of a transformer. When the voltage across a given hybrid switching circuit is zero, a controller activates the corresponding silicon-based device for an activation period and then activates the corresponding WBG device for a predetermined duty cycle less than the activation period. While the WBG device is still active, the silicon-based device is deactivated. After the silicon-based device is deactivated, the WBG is deactivated before the next hybrid switching circuit is activated.

The present invention provides a number of advantages over existing topologies. By using the WBG device for only a short period while the silicon-based device turns off, the RMS current is kept low in the WBG device. The present invention can therefore be used to absorb larger currents than its continuous rating during the silicon-based device's commutation without violating its safe operating area. This allows a lower number of WBG devices in parallel with the silicon-based device and/or less expensive WBG devices with lower current ratings. In addition, by keeping the WBG device off during the conduction of the parallel silicon-based device, the $i^2R$ losses are primarily confined to the silicon-based device, which can take advantage of its larger die to absorb and dissipate thermal stresses. These and other features and advantages of the present invention will become apparent from the following description of the invention, when viewed in accordance with the accompanying drawings and the appended claim.

DETAILED DESCRIPTION OF THE CURRENT EMBODIMENT

Figure 1:
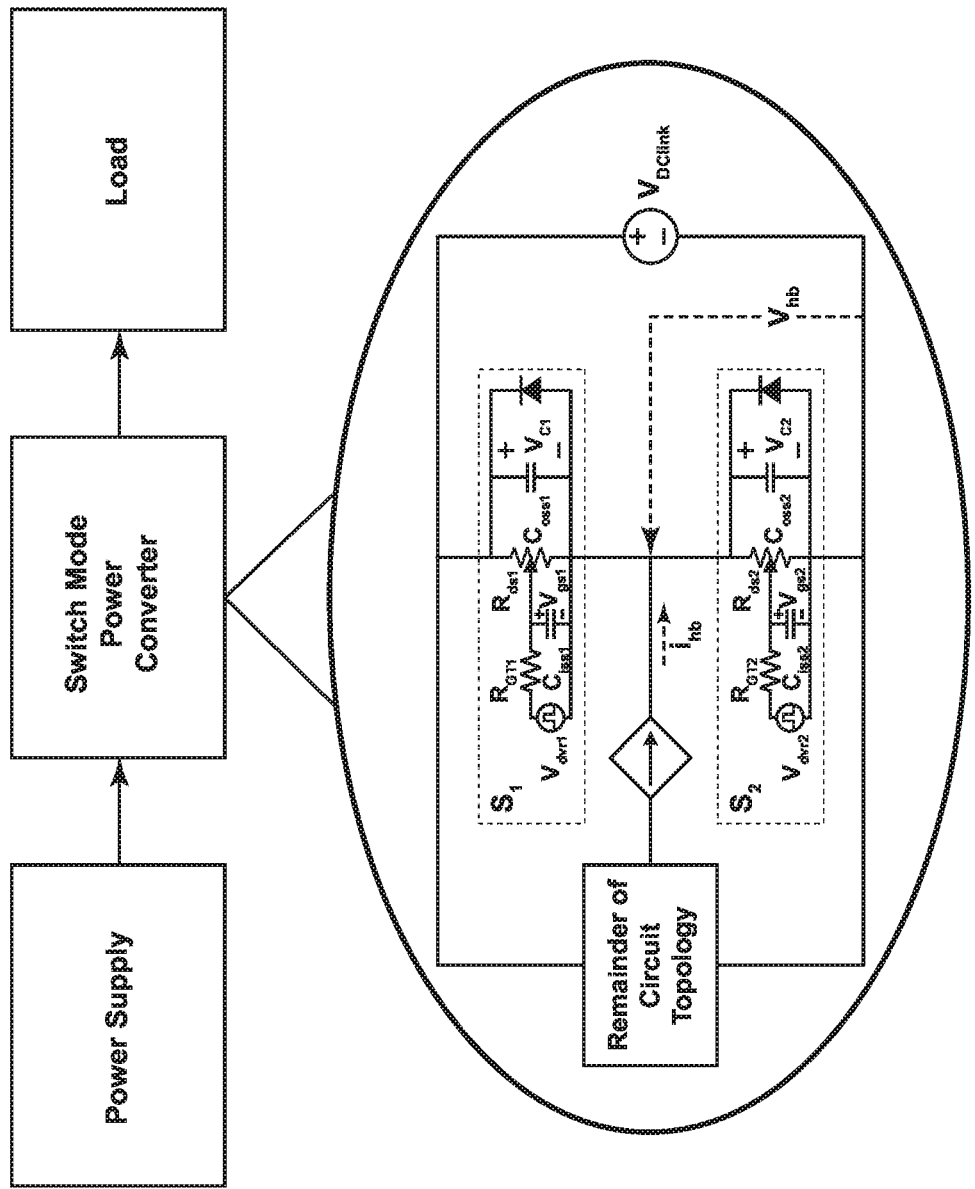
FIG. 1 is an embodiment of a prior art SMPC utilizing ZVS.
Figure 2:
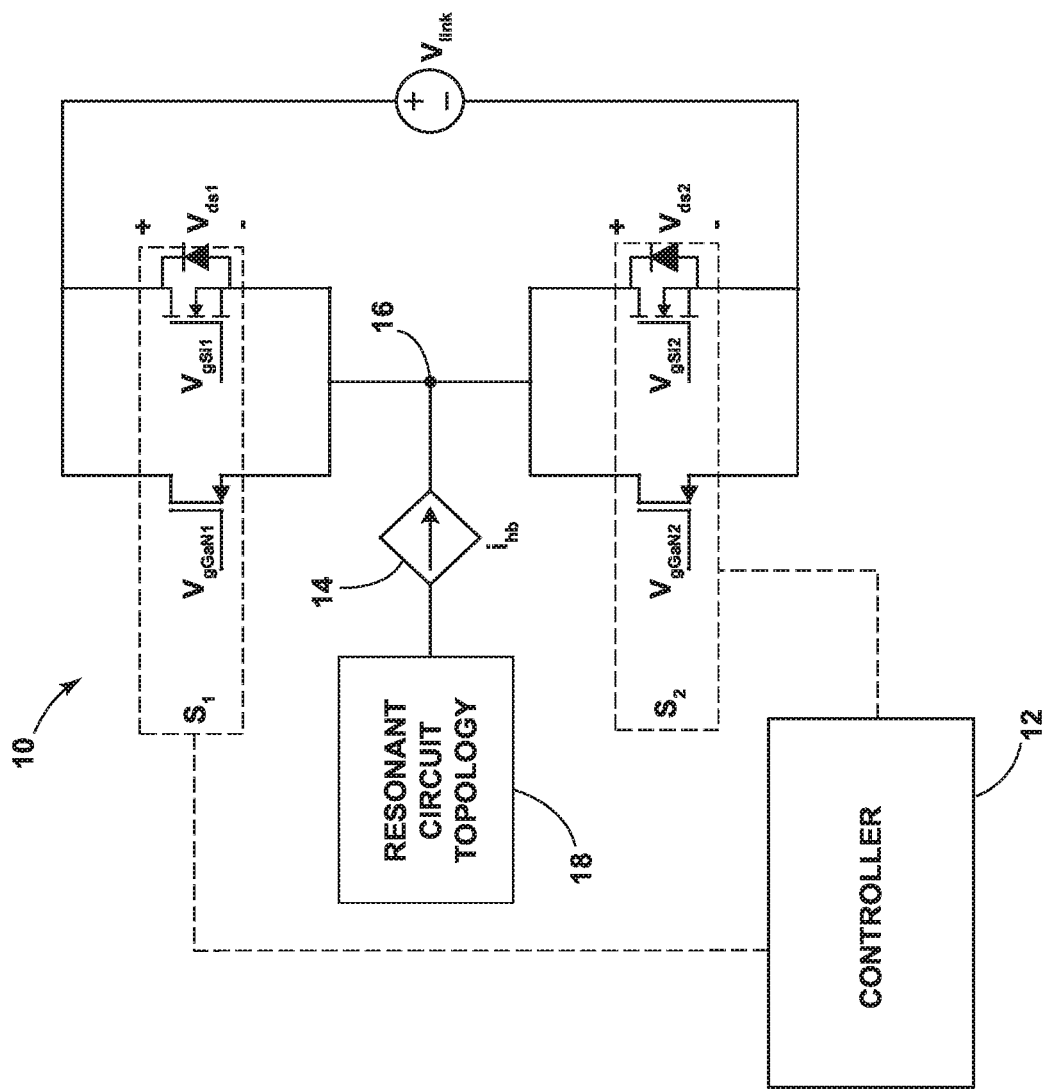
FIG. 2 is a circuit diagram in accordance with one embodiment.

Referring to FIG. 2, a power converter including a half-bridge is illustrated and generally designated 10. The power converter 10 is an SMPC that provides ZVS in the present embodiment, and includes resonant circuit topology 18 connected to the half-bridge converter. The power converter 10 also includes a controller 12 operatively coupled to each switch of first and second hybrid switching circuits, $S_1$ and $S_2$. The hybrid switching circuits $S_1$ and $S_2$ are electrically connected to a controlled current source 14 at a common node 16. Each hybrid switching circuit $S_1$ and $S_2$ includes first and second dissimilar switches that are parallel connected along respective first and second branches. Each parallel switching circuit $S_1$ and $S_2$ includes a silicon-based device parallel connected to a WBG device. In the illustrated embodiment, the silicon-based device is an Si MOSFET and the WBG device is a GaN HEMT. Other silicon-based devices can include, for example, an Si insulated-gate bipolar transistor (IGBT). Other WBG devices can include, for example, silicon nitride devices, silicon carbide devices, boron nitride devices, aluminum nitride devices, and semiconductor devices with diamond material.

As noted above, the controller 12 is operatively connected to each of the switching devices such that each switching device can independently be turned on and off. The input node 16 is connected to the controlled current source 14 and accepts AC current $i_{hb}$, and a voltage source Vhnk is connected in series across the two parallel circuits. The controlled current source 14 is depicted as modelling the behavior of the resonant converter topology 18. The AC current is not necessarily sinusoidal or of fixed frequency, and can be a high frequency waveform. For example, in embodiments where the SMPC is embodied as a dual active bridge (DAB) converter, the leakage inductance of the DAB transformer acts as a current source during the period in which both hybrid switching circuits $S_1$ and $S_2$ are off, forcing current into or out of the midpoint, thereby moving the midpoint voltage from one rail to the other. The current in the leakage inductance is simultaneously being driven by the voltage across it, which includes the midpoint voltage. Thus, the current is changing as it is driving the half-bridge voltage. Further, the voltage source $V_{link}$ in FIG. 2 represents an arbitrary source or storage element, created by the SMPC topology or by connection to the load, across the half-bridge connection of hybrid switching circuits $S_1$ and $S_2$. The resonant circuit topology 18 represents the greater circuit topology which in combination with $S_1$ and $S_2$ comprises the entirety of the SMPC, positioned between a power supply and a load.

Figure 3:
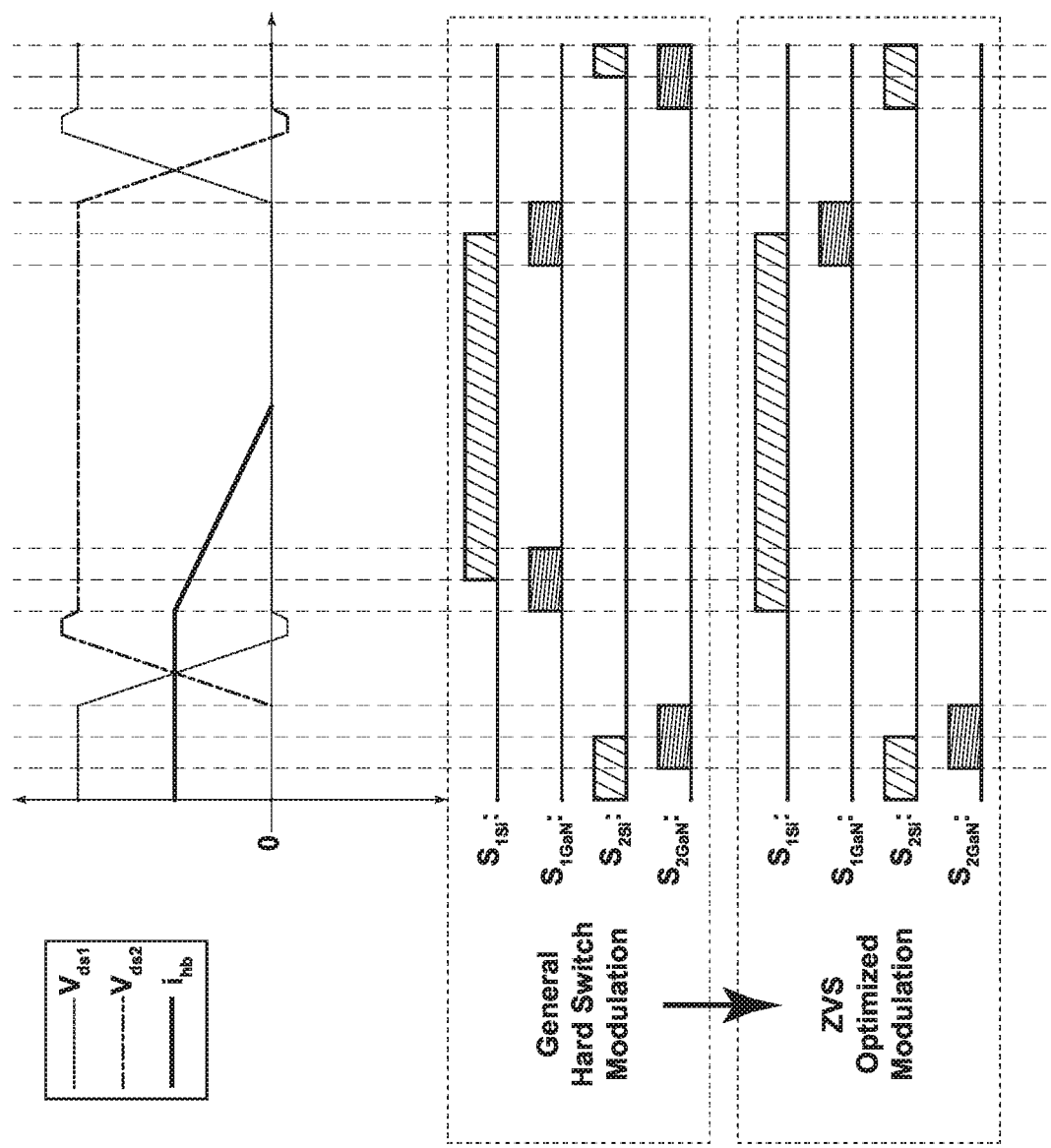
FIG. 3 is a timing diagram for operation of the circuit of FIG. 2.

In ZVS applications, shown at bottom in FIG. 3, the controller 12 is configured to operate each of the WBG devices and silicon-based devices in the following manner First, the silicon-based device of either $S_1$ or $S_2$ is turned on for an activation period. Toward the end of the activation period, the corresponding WBG device is turned on for a small duty ratio. The silicon-based device is turned off during the duty ratio of the WBG device, after which time the WBG device is turned off. The controller 12 waits a predetermined delay period and then turns on the other silicon-based device for an equivalent activation period. Toward the end of the activation period, the corresponding WBG device is turned on for a small duty ratio. The silicon-based device is turned off during the duty ratio of the WBG device, after which time the WBG device is turned off. The controller 12 waits a predetermined delay period and then starts the process over again. The predetermined delay period is equivalent to the time it takes for the drain-to-source voltage corresponding to the hybrid switching circuit that is about to be activated ($V_{ds1}$, $V_{ds2}$) to reach zero. The silicon-based device for each switching circuit is only turned on when the corresponding voltage $V_{ds1}$, $V_{ds2}$ passes zero volts and is clamped by the anti-parallel diode of the silicon-based device, being approximately between 0V and 7V in the present embodiment. Persons of skill in the art will note that the waveform at the top of FIG. 3 is highly idealized for conceptualization. The idealized waveform is used for demonstration only and in no way limits the operation of the present invention.

Figure 4:
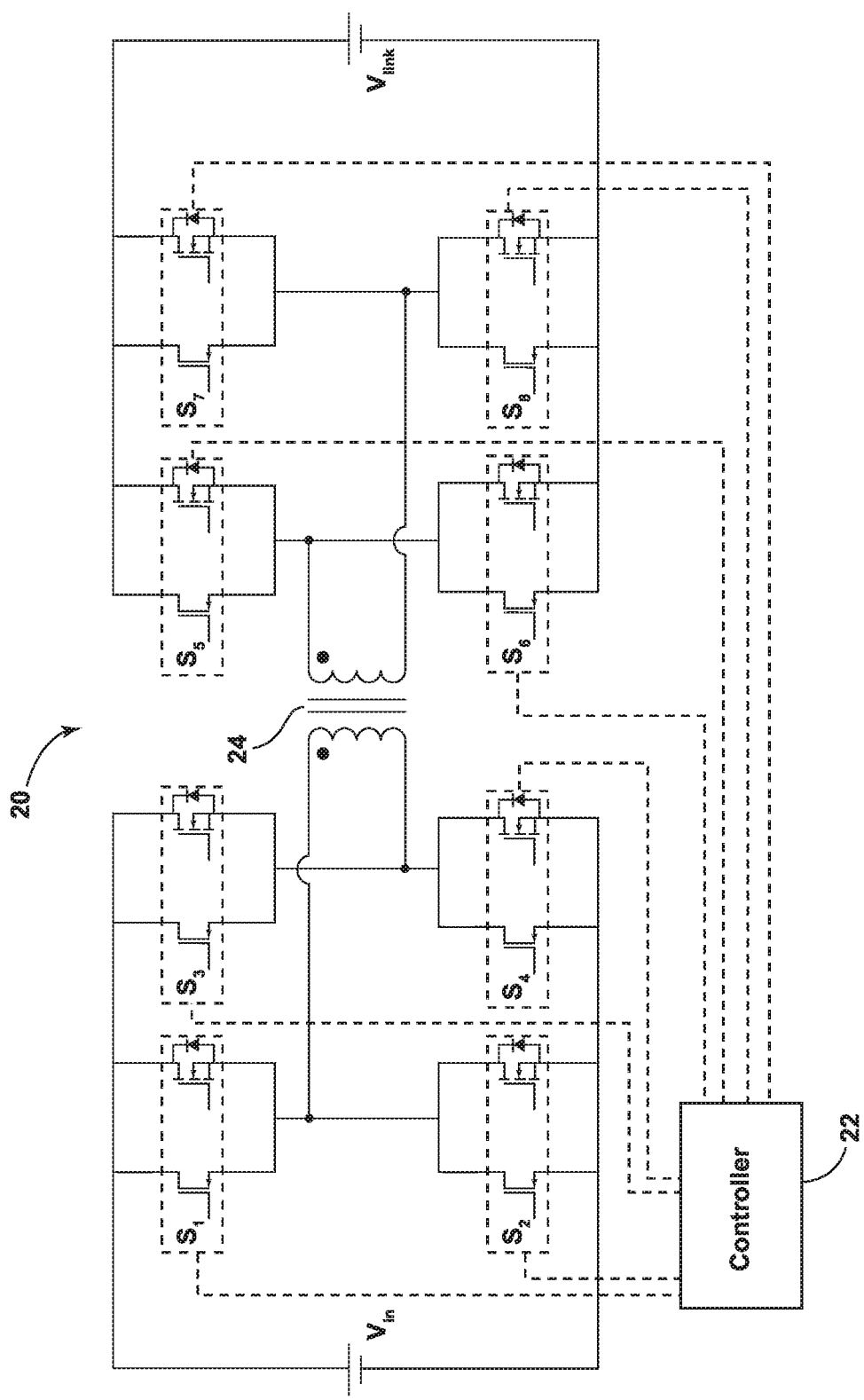
FIG. 4 is a circuit diagram in accordance with another embodiment.

Referring to FIG. 4, a dual-active bridge (DAB) SMPC is shown and generally designated 20. Eight hybrid switching circuits labeled $S_1$ through $S_8$ are connected in two full-bridge configurations, one on each side of transformer. Each hybrid circuit contains a WBG device and a silicon-based device connected in parallel. A controller 22 is operatively coupled to each device in each hybrid switching circuit. The controller 22 operates the SMPC using a ZVS technique. The controller 22 operates each switching circuit by first activating the silicon-based device for an activation period and then activating the WBG device for a small duty ratio that is smaller than the activation period. The silicon-based device is deactivated while the WBG device is activated and the controller does not activate the next switching circuit until the WBG device is deactivated.

In the method described above, the silicon-based devices and the WBG devices turn on with zero voltage stress because of the delay period described above. Only the silicon-based device is used during conduction to take advantage of its larger die for enhanced thermal performance. This also allows the parallel switching circuit to accept larger currents than if both switches were turned on because the circuit is not limited by the WBG device's poorer thermal characteristics, which is in turn due to its small die size. There is no significant benefit in turning on the WBG device during turn-on of the silicon-based device because the silicon-based device is soft-switching during turn-on and has a sufficiently fast rise time.

The WBG device is used during commutation to undertake the voltage stress and to take advantage of its faster fall time and lower $E_{off}$ loss relative to the silicon-based device. Using the WBG device for only a short period while the silicon-based device turns off has additional advantages. For example, it keeps the RMS current low in the WBG device and therefore the device can absorb larger currents than its continuous rating during the silicon-based device's commutation. This means a lower number of WBG devices can be used in parallel with the silicon-based device and/or less expensive WBG devices with lower current ratings can be used in parallel with the silicon-based device.

When the WBG device is activated the voltage is held low across the silicon-based device while it turns off. This eliminates the silicon-based device's turn-off loss and its miller plateau, which increases its turn-off speed. Since the WBG device has significantly faster fall-time and smaller turn-off loss, both the switch losses and total turn-off time can be reduced. Not activating the WBG device during the silicon-based device's conduction period allows $i^2R$ losses to primarily be confined to the silicon-based device. This is optimal because the silicon-based device can use its larger die to absorb and dissipate the thermal stresses more effectively than the WBG device. Additionally, the silicon-based device can also absorb and dissipate a larger amount of thermal stresses than the WBG device.

The above description is that of a current embodiment of the invention. Various alterations and changes can be made without departing from the spirit and broader aspects of the invention. This disclosure is presented for illustrative purposes and should not be interpreted as an exhaustive description of all embodiments of the invention or to limit the scope of the claims to the specific elements illustrated or described in connection with these embodiments. Any reference to elements in the singular, for example, using the articles "a," "an," "the," or "said," is not to be construed as limiting the element to the singular.

The invention claimed is:

1. A method for achieving zero voltage switching in a switch mode power converter:
   providing first and second hybrid switching circuits electrically connected in series as a half-bridge of a dual active bridge, the first hybrid switching circuit including a first wide bandgap device that is parallel connected to a first silicon-based device, the second hybrid switching circuit including a second wide bandgap device that is parallel connected to a second silicon-based device;
   activating the first silicon-based device for a first activation period;
   activating the first wide bandgap device for a first duty cycle less than the first activation period to cover-up deactivation of the first silicon-based device at the conclusion of the first activation period;
   deactivating the first wide bandgap device at the conclusion of the first duty cycle;
   activating the second silicon-based device for a second activation period;
   activating the second wide bandgap device for a second duty cycle less than the second activation period to cover-up deactivation of the second silicon-based device at the conclusion of the second activation period; and
   deactivating the second wide bandgap device at the conclusion of the second duty cycle,
   wherein the first wide bandgap device is deactivated except during the first duty cycle, such that the first wide bandgap device is only activated to cover-up deactivation of the first silicon-based device, and wherein the second wide bandgap device is deactivated except during the second duty cycle, such that the second wide bandgap device is only activated to cover-up deactivation of the second silicon-based device.

2. The method of claim 1 further including waiting a delay period after the deactivation of the first silicon-based device before the activation of the second silicon-based device.

3. The method of claim 2 wherein the delay period is equal to or greater than the time it takes for a voltage across the second silicon-based device to reach zero.

4. The method of claim 1 wherein the first silicon-based device and the second silicon-based device each include a silicon MOSFET or a silicon IGBT.

5. The method of claim 1 wherein the first wide bandgap device and the second wide bandgap device are selected from a group consisting of gallium nitride (GaN), silicon carbide (SiC), boron nitride (BN), aluminum nitride (AlN), and diamond.

6. The method of claim 1 wherein the first duty cycle of the first wide bandgap device is equal to the second duty cycle of the second wide bandgap device.

7. The method of claim 1 wherein the first activation period of the first silicon-based device is equal to the second activation period of the second silicon-based device.

8. A hybrid device comprising:
   a first hybrid switching circuit and a second hybrid switching circuit each including a wide bandgap device that is parallel-connected to a silicon-based device, the first hybrid switching circuit and the second hybrid switching circuit being series connected with each other as a half-bridge of a dual active bridge converter; and
   a controller electrically connected to the first hybrid switching circuit and the second hybrid switching circuit;
   wherein the first hybrid switching circuit and the second hybrid switching circuit are electrically connected to a power supply at a common node;
   wherein the controller is configured to operate the first hybrid switching circuit and second hybrid switching circuit respectively according the following switching sequence:
   (i) activate the silicon-based device for an activation period,
   (ii) activate the wide bandgap device for a predetermined duty cycle less than the activation period,
   (iii) deactivate the silicon-based device while the wide bandgap device is activated, and
   (iv) deactivate the wide bandgap device,
   wherein the wide bandgap device is deactivated except during the predetermined duty cycle, such that the wide bandgap device is only activated to cover-up deactivation of the silicon-based device, wherein the first and second hybrid switching circuits are sequentially operated to convert an alternating current of the power supply into a link voltage for the dual active bridge converter.

9. The hybrid device of claim 8 wherein the silicon-based device of the first and second hybrid switching circuits includes a silicon MOSFET or a silicon IGBT.

10. The hybrid device of claim 8 wherein the wide bandgap device of the first and second hybrid switching circuits is selected from a group consisting of gallium nitride (GaN), silicon carbide (SiC), boron nitride (BN), aluminum nitride (AlN), and diamond.

11. A method comprising:
    providing first and second hybrid switching circuits electrically connected in series as a half-bridge converter of a dual active bridge, the first hybrid switching circuit including a first wide bandgap device parallel connected to a first silicon-based device and including a first antiparallel diode in parallel with the first silicon-based device, the second hybrid switching circuit including a second wide bandgap device parallel connected to a second silicon-based device and including a second antiparallel diode in parallel with the second silicon-based device, wherein the first and second hybrid switching circuits are connected to a power supply at a common node;
    activating the first silicon-based device for an activation period;
    activating the first wide bandgap device for a first predetermined duty cycle less than the activation period;
    deactivating the first silicon-based device while the first wide bandgap device is activated;
    deactivating the first wide bandgap device;
    activating the second silicon-based device for the activation period;

activating the second wide bandgap device for a second predetermined duty cycle less than the activation period; and deactivating the second silicon-based device while the second wide bandgap device is activated, such that the first and second hybrid switching circuits convert an alternating current from the power supply into a link voltage for a power converter;

deactivating the second wide bandgap device;

wherein the first wide bandgap device is deactivated except during the first predetermined duty cycle, such that the first wide bandgap device is only activated to cover-up deactivation of the first silicon-based device, and wherein the second wide bandgap device is deactivated except during the second duty cycle, such that the second wide bandgap device is only activated to cover-up deactivation of the second silicon-based device.

12. The method of claim 11 wherein the first silicon-based device and the second silicon-based device each include a silicon MOSFET or a silicon IGBT.

13. The method of claim 11 wherein the first wide bandgap device and the second wide bandgap device are selected from a group consisting of gallium nitride (GaN), silicon carbide (SiC), boron nitride (BN), aluminum nitride (AlN), and diamond.

14. The method of claim 11 wherein the first predetermined duty cycle of the first wide bandgap device is equal to the second predetermined duty cycle of the second wide bandgap device.

15. The method of claim 11 further including waiting a predetermined delay period after the deactivation of the first silicon-based device before the activation of the second silicon-based device.

* * * * *